(12) United States Patent
Chi et al.

(10) Patent No.: US 10,665,804 B2
(45) Date of Patent: May 26, 2020

(54) ORGANIC LIGHT EMITTING DIODE AND DISPLAY DEVICE

(71) Applicant: Wuhan China Star Optoelectronics Semiconductor Display Technology Co., Ltd., Wuhan, Hubei (CN)

(72) Inventors: Mingming Chi, Guangdong (CN); Lei Pei, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 368 days.

(21) Appl. No.: 15/751,050

(22) PCT Filed: Dec. 19, 2017

(86) PCT No.: PCT/CN2017/117132
§ 371 (c)(1),
(2) Date: Feb. 7, 2018

(87) PCT Pub. No.: WO2019/071816
PCT Pub. Date: Apr. 18, 2019

(65) Prior Publication Data
US 2020/0091453 A1    Mar. 19, 2020

(30) Foreign Application Priority Data
Oct. 12, 2017    (CN) .......................... 2017 1 0948542

(51) Int. Cl.
*H01L 21/00* (2006.01)
*H01L 51/50* (2006.01)
*H01L 27/32* (2006.01)

(52) U.S. Cl.
CPC .......... *H01L 51/50* (2013.01); *H01L 27/3211* (2013.01)

(58) Field of Classification Search
CPC ... H01L 51/50; H01L 27/3211; H01L 27/3244
See application file for complete search history.

(56) References Cited

U.S. PATENT DOCUMENTS 9,252,372 B2 *   2/2016   Yersin ................... C09K 11/06
2005/0230684 A1 *  10/2005  Seo ..................... H01L 27/3248
                                                              257/72
(Continued)

FOREIGN PATENT DOCUMENTS

CN          104659227 A      5/2015
JP          2008258198 A    10/2008

*Primary Examiner* — Laura M Menz
(74) *Attorney, Agent, or Firm* — Hemisphere Law, PLLC; Zhigang Ma

(57) ABSTRACT

An OLED and a display device has OLED are provided. The OLED includes an anode; an organic emission layer positioned on the anode, the organic emission layer includes a multilayer functional layer; a diffusion layer is positioned between at least two adjacent functional layers of the multilayer functional layer, the diffusion layer dissociates metal ions, the metal ions is diffusing to the functional layer adjacent to the diffusion layer for filling traps of the functional layer which is adjacent to the diffusion layer. The OLED of this invention could fill traps of the organic molecular materials, and decreases joule heating effect which generated by getting rid of the carriers bonded by traps. Therefore, it achieves to enhance life time and luminous performance of OLED.

20 Claims, 2 Drawing Sheets

(56) References Cited

U.S. PATENT DOCUMENTS

| | | | |
|---|---|---|---|
| 2007/0034862 A1* | 2/2007 | Parham | H01L 51/0015 257/40 |
| 2015/0041773 A1* | 2/2015 | Park | H01L 51/0058 257/40 |
| 2019/0006435 A1* | 1/2019 | Chen | H01L 51/5056 |
| 2019/0237708 A1* | 8/2019 | Yi | C23C 14/042 |
| 2019/0280060 A1* | 9/2019 | Liu | H01L 51/56 |
| 2019/0302529 A1* | 10/2019 | Zha | G02F 1/133305 |
| 2020/0091453 A1* | 3/2020 | Chi | H01L 51/50 |

* cited by examiner

ORGANIC LIGHT EMITTING DIODE AND DISPLAY DEVICE

RELATED APPLICATIONS

The present application is a National Phase of International Application Number PCT/CN2017/117132, filed Dec. 19, 2017, and claims the priority of China Application No. 201710948542.5, filed Oct. 12, 2017.

FIELD OF THE DISCLOSURE

The disclosure relates to an organic light emitting technical field, and more particularly to an organic light emitting diode and a display device has organic light emitting diode, which enhances life time and luminous performance.

BACKGROUND

Organic light emitting diode (OLED) as a new display technology which is become a mainstream of display industry trends. Comparing to Liquid Crystal Display (LCD), OLED has number of advantageous such as low power consumption, fast response speed, wide view angle, wide color gamut, bendable. However, lifetime and luminous performance are always a technical challenge of the OLED. Please refer to FIG. 1. FIG. 1 is a lifetime curve schematic view of an organic light emitting diode of prior art. Shown as FIG. 1, with increases the using time (Time) of the OLED (value of horizontal axis of FIG. 1), the ratio ($L/L_0$) of the currently brightness (L) and initially brightness ($L_0$) of the OLED is greatly decreasing (value of vertical axis of FIG. 1). It is said that the brightness of the OLED is fast decay within the using time, and causes poor lifetime and luminous performance of OLED.

The principle of OLED emitting is: the electrodes and holes are respectively injected by cathode and anode, and transfer to the emission layer, and composited to exciton in the emission layer, and the exciton emitting by radiative transfer (at this time, the electrodes and the holes are called carrier). Analyze the reason of the technical challenge of OLED according to the principle above, each of functional layers of the OLED is organic small molecular materials, and exist in traps of different depth. Wherein, the carriers bonded by the shallow trap could be released by joule heating effect, and the carriers bonded by the deep trap is hard to get rid of, and while the bonding carriers (here is called polaron) is contacting with the triplet state carriers which has longer lifetime, the energy of the polaron will greatly increases and caused the molecular bond broken. The polaron molecular bond broken causes the molecular structure of the bonding carriers changed such that effects lifetime and luminous performance of OLED.

In order to solve the problem above, it could improve two aspects to emitting material and device structure. However, developing new emitting material needs to experience design, synthesis, purification and validation stages, the development period is long and the yield of material is low such that hard to achieve mass produce. Therefore, this invention is improving form the device structure, provides a new organic light emitting diode and a display device has organic light emitting diode; it could effectively improve problem of lifetime and luminous performance of OLED.

SUMMARY

A technical problem to be solved by the disclosure is to provide an organic light emitting diode and a display device which could fill traps of the organic materials and decrease joule heating effect which generated by OLED for getting rid of carrier bounding in traps. So that enhances lifetime and luminous performance of OLED, and solves problem of organic light emitting diode in prior art.

An objective of the disclosure is achieved by following embodiments. In particular, an organic light emitting diode, comprising an anode; an organic emission layer positioned on the anode, the organic emission layer includes a multilayer functional layer; and a cathode positioned on the organic emission layer; wherein electrons and holes are transmitting to the organic emission layer by the cathode and the anode respectively and combining with the organic emission layer for light-emitting; a diffusion layer is positioned between at least two adjacent functional layers of the multilayer functional layer, the diffusion layer dissociates metal ions, the metal ions is diffusing to the functional layer adjacent to the diffusion layer for filling traps of the functional layer which is adjacent to the diffusion layer.

In an embodiment, the molecular of the diffusion layer includes an organic part and an inorganic part, wherein the organic part is an energy level source of the diffusion layer such that the diffusion layer could transfer or block the electrodes and/or holes; the inorganic part is dissociable metal ions, the metal ions could dissociate and diffuse from the diffusion layer to the adjacent functional layer for filling traps of the functional layer.

In an embodiment, the organic part of the structure of the diffusion layer is benzene ring or five-membered heterocyclic or six-membered heterocyclic which containing at least one of nitrogen, oxygen, sulfur and phosphorous.

In an embodiment, the metal ions are forming by at least one of main group I, main group II, subgroup III, subgroup IV and subgroup V.

In an embodiment, the organic light emitting diode comprises a substrate, the substrate is for supporting entire organic light emitting diode, the anode, the organic emission layer and the cathode are sequentially forming on the substrate.

In an embodiment, the multilayer functional layer comprising a hole inject layer, a hole transporting layer, an emitting layer, an electron transport layer and an electron inject layer, and between any two of adjacent the hole inject layer, the hole transporting layer, the emitting layer, the electron transport layer and the electron inject layer are positioning the diffusion layer.

In an embodiment, the diffusion layer is positioned between the hole inject layer and the hole transporting layer, and the diffusion layer is positioned between the hole transporting layer and the emitting layer.

In an embodiment, the diffusion layer is positioned between the hole inject layer and the hole transporting layer, or the diffusion layer is positioned between the hole transporting layer and the emitting layer.

In an embodiment, between the electron inject layer and the electron transport layer and between the electron transport layer and the emitting layer are respectively positioned the diffusion layers; or between the electron inject layer and the electron transport layer is positioned the diffusion layer; or between the electron transport layer and the emitting layer is positioned the diffusion layer.

According to another aspect of the disclosure, the disclosure further provides a display device. The display device includes a plurality of the organic light emitting diode; and a driving circuit is electrically connecting with the organic light emitting diodes for controlling to emit the organic light emitting diodes.

In sum, the OLED and the display device of the embodiment in this disclosure, the diffusion layer is positioned between the adjacent functional layers of the organic emission layer, and diffuses the metal ions which dissociated by the diffusion layer to adjacent functional layer for filling traps of the adjacent functional layer. Therefore, the traps of the functional layer of the organic emission layer is eliminated, which is to decrease joule heating effect generated by the carriers or excitons getting rid of bounding in traps of OLED. It enhances life time and luminous performance of OLED finally.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
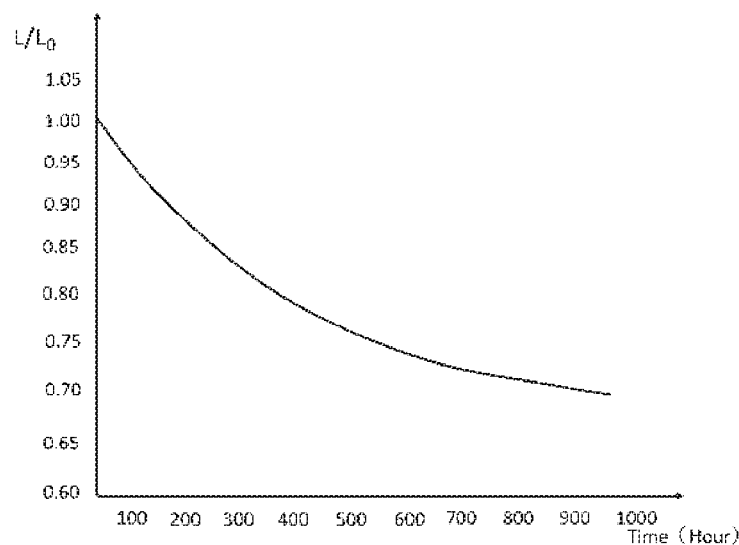
FIG. 1 is a lifetime curve schematic view of an organic light emitting diode of prior art.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

Further, unless specified otherwise, in the description of the present invention, "plural" means two or more than two. The term "operation", when appearing in the specification, does not just include an independent operation and may also include a desired effect of the operation achieved with the operation when the operation is not distinguishable from other operations. The symbol "-" used in the present invention to define a numeric range, of which the minimum and maximum are respectively corresponding to the figures set in front of and behind of the symbol "-". In the attached drawings, similar structures or identical units are designated with the same reference numerals.

An organic light emitting diode (OLED) is provided by this disclosure, which could fill traps in the organic material of OLED such that decreases joule heating effect which generated by OLED for getting rid of carrier bounding in traps state. So that achieves to enhance lifetime and luminous performance of OLED. The disclosure will be further described in detail with reference to accompanying drawings and preferred embodiments as follows.

Figure 2:
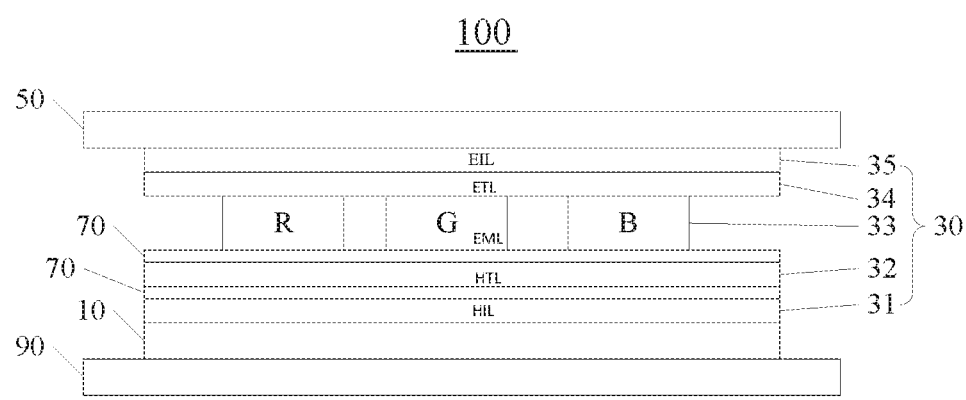
FIG. 2 is a structural schematic view of an organic light emitting diode according to an embodiment of the disclosure.

Please refer to FIG. 2. FIG. 2 is a structural schematic view of an organic light emitting diode according to an embodiment of the disclosure. In this embodiment, the OLED 100 comprised an anode 10, an organic emission layer 30 is positioned on the anode 10 and a cathode 50 is positioned on the organic emission layer 30. The electrons and holes are transmitting to the organic emission layer 30 according to respectively injecting by the cathode 50 and the anode 10, and combining with the organic emission layer 30 for light-emitting. Wherein the electrons and holes are called carriers.

In this embodiment, the organic emission layer 30 includes a multilayer functional layer, and a diffusion layer 70 is positioned between at least two adjacent functional layers of the multilayer functional layer, the diffusion layer 70 is forming by compound or complexes which contains highly dissociated metal ions. Therefore, the metal ions dissociated by the diffusion layer 70 could be diffused to the functional layer adjacent to the diffusion layer for filling traps of the functional layer which is adjacent to the diffusion layer In the embodiment of this disclosure, the OLED 100 has a correspondingly diffusion layer 70 positioned between the organic emission layer 30 and at least two adjacent functional layers, the metal ions dissociated by the diffusion layer 70 diffuses to the functional layer adjacent to the diffusion layer for filling traps of the functional layer. Therefore, it decreases joule heating effect which generated by OLED 100 for getting rid of carrier bounding in traps. At last achieves to enhance life time and luminous performance of OLED.

In this embodiment, the molecular of the diffusion layer 70 includes an organic part and an inorganic part. Wherein, the organic part is an energy level source of the diffusion layer 70 which provides a large conjugated π orbitals for the diffusion layer 70 such that provides suitable LUMO/HOMO level for the diffusion layer 70. It achieves that the diffusion layer 70 could transfer or block the electrodes and/or holes according to position of the OLED. The inorganic part has highly dissociated metal ions, the metal ions could dissociate and diffuse from the diffusion layer 70 to the adjacent functional layers for filling traps of the adjacent functional layer. LUMO is abbreviation of Lowest Unoccupied Molecular Orbital, HOMO is abbreviation of Highest Occupied Molecular Orbital. The energy difference between the HOMO and LUMO is energy bandgap, the energy difference is called HOMO-LUMO level which used to measure whether a molecular is easily to be excited or not. And the energy bandgap is more small, the molecular is more easily be excited.

In this embodiment, the organic part of the structure of the diffusion layer 70 is benzene ring or five-membered heterocyclic or six-membered heterocyclic which containing at least one of nitrogen, oxygen, sulfur and phosphorous. In this embodiment, it's not specifically limited the organic part of the structure of the diffusion layer 70, only needs to satisfy requirement of OLED, and also has enough high HOMO-LUMO level for ensuring the diffusion layer 70 could transfer or block the electrodes and/or holes.

In this embodiment, the metal ions of inorganic part of structure of the diffusion layer 70 are forming by at least one of main group I, main group II, subgroup III, subgroup IV and subgroup V. The metal ions forming by the above metal element which could dissociate and diffuse from the diffusion layer to the adjacent functional layer for filling traps of the functional layer.

Please refer to FIG. 2. FIG. 2 is a structural schematic view of an organic light emitting diode according to an embodiment of the disclosure. In one of embodiment, the organic emission layer 30 comprises a hole inject layer (HIL) 31, a hole transporting layer (HTL) 32, an emitting layer (EML) 33, an electron transport layer (ETL) 34 and an electron inject layer (EIL) 35. Wherein, the HIL 31, the HTL 32, the EML 33, the ETL 34 and the EIL 35 are sequentially stacking to each other, the diffusion layer 70 is positioned between the HIL 31 and the HTL 32. At the same time, a diffusion layer 70 is also positioned between the HTL 32 and the EML 33.

In the above embodiment, the diffusion layer 70 is positioned between the HIL 31 and the HTL 32, and the diffusion layer 70 is positioned between the HTL 32 and the EML 33. And filled the traps of the HIL 31, the HTL 32 and the EML 33 by the metal ions which dissociated from the adjacent diffusion layer 70 such that reduces the probability that carriers and excitons are bound by the trap on the functional layer (such as HIL 31, HTL 32 and EML 33), it also could correspondingly reduce probability of annihilates polarons which transferred from the excitons. At last, it decreases joule heating effect which generated by OLED 100 for getting rid of carrier bounding in traps such that enhances lifetime and luminous performance of OLED. In addition, the organic part of the diffusion layer 70 let the diffusion layer 70 level could transfer or block the electrodes or holes. For example, while the diffusion layer 70 is positioned between the EML 33 and HTL 32, the diffusion layer 70 level could ensure the holes transfer from the diffusion layer 70 to the EML 33, at the same time also block the electrodes from the cathode 50 pass through the diffusion layer 70.

It is noted that, in another embodiment of this disclosure, only positioning the diffusion layer 70 between the HIL 31 and the HTL 32. At this time, the metal ions dissociated from the diffusion layer 70 fills traps of adjacently the HIL 31 and the HTL 32. Or, only positioning the diffusion layer 70 between the HTL 32 and the EML 33. At this time, the metal ions dissociated from the diffusion layer 70 fills traps of adjacently the HTL 32 and the EML 33.

It is noted that, in another embodiment of this disclosure, the diffusion layer (not shown) is positioned between the EIL 35 and the ETL 34, and also the diffusion layer (not shown) is positioned between the ETL 34 and the EML 33. In this embodiment, the diffusion layers are respectively positioned between the EIL 35 and the ETL 34, and between the ETL 34 and the EML 33 for filling the traps of the EIL 35, the ETL 34 and the EML 33 by the metal ions which dissociated from the adjacent diffusion layer such that reduces the probability that carriers and excitons are bound by the trap state on the functional layer (such as EIL 35, ETL 34 and EML 33), it also could correspondingly reduce probability of annihilates polarons which transferred from the excitons. At last, it decreases joule heating effect which generated by OLED 100 for getting rid of carrier bounding in traps such that enhances lifetime and luminous performance of OLED. In addition, the organic part of the diffusion layer 70 let the diffusion layer 70 level could transfer or block the electrodes or holes. For example, while the diffusion layer 70 is positioned between the EML 33 and ETL 34, the diffusion layer 70 level could ensure the electrodes transfer from the diffusion layer 70 to the EML 33, at the same time also block the holes from the anode 10 pass through the diffusion layer 70.

It is noted that, in this embodiment, only positioning a diffusion layer (not shown) between the EIL 35 and the ETL 34. At this time, filling traps of the adjacent the EIL 35 and the ETL 34 by metal ions which associated by the diffusion layer. Or, only positioning a diffusion layer (not shown) between the ETL 34 and the EML 33. At this time, filling traps of the adjacent the ETL 34 and the EML 33 by metal ions which associated by the diffusion layer.

It is noted that, in another embodiment, it also could respectively positioning diffusion layers 70 between the HIL 31 and the HTL 32, the HTL 32 and the EML 32, the ETL 34 and the EML 33 and the EIL 35 and the ETL 34. In another embodiment, it also could respectively positioning diffusion layers 70 between the HIL 31 and the HTL 32, and the EIL 35 and the ETL 34. Furthermore, the position of the diffusion layer 70 is not limited in this disclosure, it could be positioned between any two of the adjacent functional layers.

Figure 3:
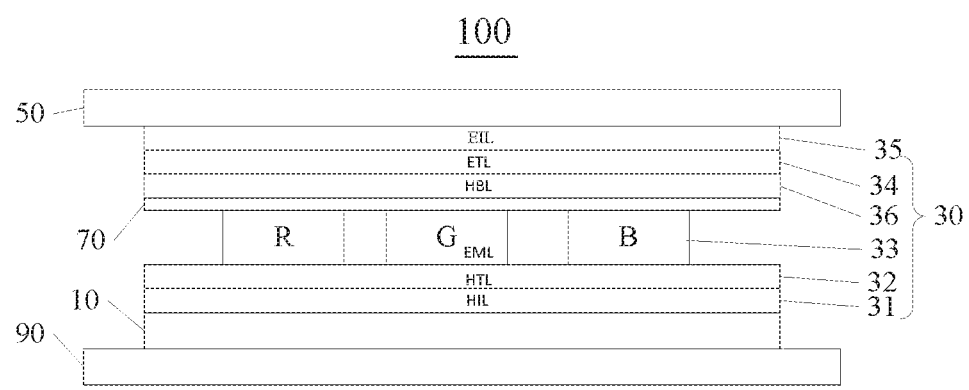
FIG. 3 is a structural schematic view of an organic light emitting diode according to another embodiment of the disclosure.

Please refer to FIG. 3. FIG. 3 is a structural schematic view of an organic light emitting diode according to another embodiment of the disclosure. In this embodiment, the organic emission layer 30 further comprises a hole blocking layer (HBL) 36 and is positioned between the EML 33 and the ETL 34, and the diffusion layer 70 is positioned between the EML 33 and HBL 36.

In another embodiment of this invention, the ETL 34 and the HBL 36 are positioned in the same layer.

In this embodiment, the organic light emitting diode 100 further comprises a substrate 90, the substrate 90 is for supporting entire organic light emitting diode 100. The anode 10, the organic emission layer 30 and the cathode 90 are sequentially forming on the substrate 90. The diffusion layer 70 is forming between any two of adjacent functional layers of the organic light emitting diode according the requirement.

Figure 4:
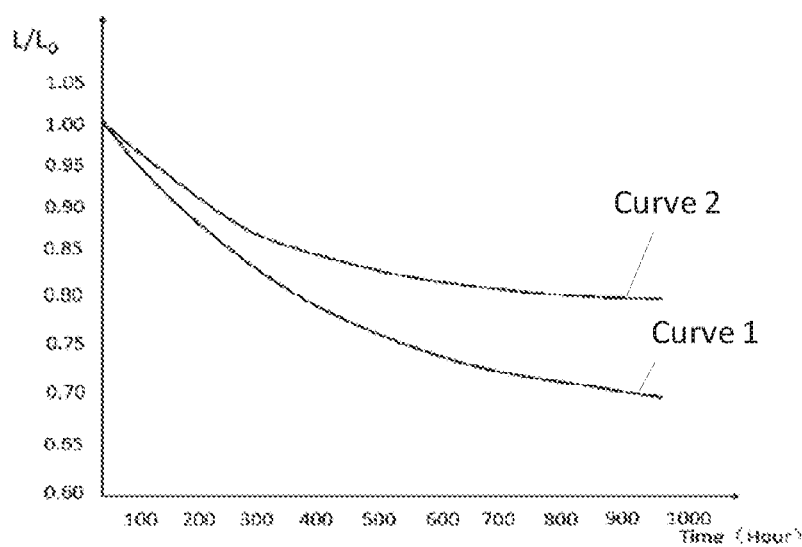
FIG. 4 is a comparison schematic diagram of the lifetime curve of organic light emitting diode of prior art and an embodiment of the disclosure.

Please refer to FIG. 4. FIG. 4 is a comparison schematic diagram of the lifetime curve of organic light emitting diode of prior art and an embodiment of the disclosure. As shown in FIG. 4, Curve 1 is lifetime curve of prior art; Curve 2 is lifetime curve of the embodiment of the disclosure. In the FIG. 4, the horizontal axis title of lifetime curve diagraph is using time of the OLED, the vertical axis title of lifetime curve diagraph is a ratio ($L/L_0$) of the currently brightness (L) and initially brightness (L$_O$). Comparing two lifetime curves of the FIG. 4, the decay speed of the lifetime curve of the OLED in prior art (which is Curve 1) is fast than the lifetime curve of the OLED in the disclosure (which is Curve 2), which is means the lifetime of the OLED in the embodiment of this disclosure is longer than the OLED in prior art; in addition, while the initially brightness (L$_O$) of the OLED in prior art as same as the OLED of the embodiment in this disclosure, and using same time, the currently brightness (L) of the OLED of the embodiment in this disclosure is better than the OLED in prior art. Therefore, illumination performance of the OLED of the embodiment in this disclosure is better than the OLED in prior art.

A display device (not shown) is provided by an embodiment of this disclosure, comprises a plurality of the organic light emitting diode 100 and a driving circuit is electrically connecting with the organic light emitting diodes for controlling to emit the organic light emitting diodes. For example, the display device could be a cell phone has liquid crystal display panel (for example Android cell phone, iOS cell phone), tablet, Mobile Internet Devices (MID), Personal Digital Assistant (PDA), notebook, television, electric paper, digital photo frame and so on.

In the OLED 100 and the display device, the diffusion layer 70 is positioned between the functional layers (for example EIL, ETL) of the organic emission layer 30, and diffuses the metal ions which dissociated by the diffusion layer 70 to adjacent functional layer for filling traps of the adjacent functional layer. The traps of the functional layer of the organic emission layer 30 is eliminated, which is to decrease joule heating effect which generated by OLED 100 for getting rid of carriers or excitons bounding in traps. At least, it enhances life time and luminous performance of OLED.

In the description of the present invention, the reference term "one embodiment", "some embodiments", "example", "specific example" or "some examples" and so on means specific features, structures and materials combined in the embodiment or example, or the characteristic being included in at least one embodiment or example. In the description of the present invention, the schematically description of the above terms not certainly indicate a same embodiment or example. Besides, the described specific feature, structure, material, or characteristic can be combined by a suitable way in anyone or multiple embodiments or examples.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. An organic light emitting diode, comprising
   an anode;
   an organic emission layer positioned on the anode, the organic emission layer includes a multilayer functional layer; and
   a cathode positioned on the organic emission layer;
   wherein electrons and holes are transmitting to the organic emission layer by the cathode and the anode respectively and combining with the organic emission layer for light-emitting; a diffusion layer is positioned between at least two adjacent functional layers of the multilayer functional layer, the diffusion layer dissociates metal ions, the metal ions is diffusing to the functional layer adjacent to the diffusion layer for filling traps of the functional layer which is adjacent to the diffusion layer.

2. The organic light emitting diode according to claim 1, wherein the molecular of the diffusion layer includes an organic part and an inorganic part, wherein the organic part as an energy level source of the diffusion layer such that the diffusion layer could transfer or block the electrodes and/or holes; the inorganic part is dissociable metal ions, the metal ions could dissociate and diffuse from the diffusion layer to the adjacent functional layer for filling traps of the functional layer.

3. The organic light emitting diode according to claim 2, wherein the organic part of the structure of the diffusion layer is benzene ring or five-membered heterocyclic or six-membered heterocyclic which containing at least one of nitrogen, oxygen, sulfur and phosphorous.

4. The organic light emitting diode according to claim 1, wherein the metal ions are forming by at least one of main group I, main group II, subgroup III, subgroup IV and subgroup V.

5. The organic light emitting diode according to claim 1, wherein the organic light emitting diode comprises a substrate, the substrate is for supporting entire organic light emitting diode, the anode, the organic emission layer and the cathode are sequentially forming on the substrate.

6. The organic light emitting diode according to claim 1, wherein the multilayer functional layer comprising a hole inject layer, a hole transporting layer, an emitting layer, an electron transport layer and an electron inject layer, and between any two of adjacent the hole inject layer, the hole transporting layer, the emitting layer, the electron transport layer and the electron inject layer are positioning the diffusion layer.

7. The organic light emitting diode according to claim 6, wherein the diffusion layer is positioned between the hole inject layer and the hole transporting layer, and the diffusion layer is positioned between the hole transporting layer and the emitting layer.

8. The organic light emitting diode according to claim 6, wherein the diffusion layer is positioned between the hole inject layer and the hole transporting layer, or the diffusion layer is positioned between the hole transporting layer and the emitting layer.

9. The organic light emitting diode according to claim 6, wherein between the electron inject layer and the electron transport layer and between the electron transport layer and the emitting layer are respectively positioned the diffusion layers; or between the electron inject layer and the electron transport layer is positioned the diffusion layer; or between the electron transport layer and the emitting layer is positioned the diffusion layer.

10. The organic light emitting diode according to claim 2, wherein the multilayer functional layer comprising a hole inject layer, a hole transporting layer, an emitting layer, an electron transport layer and an electron inject layer, and between any two of adjacent the hole inject layer, the hole transporting layer, the emitting layer, the electron transport layer and the electron inject layer are positioning the diffusion layer.

11. A display device, comprising
    a plurality of the organic light emitting diode; and
    a driving circuit electrically connecting with the organic light emitting diodes for controlling to the organic light emitting diodes emit;
    wherein each of the organic light emitting diodes comprises an anode;

an organic emission layer positioned on the anode, the organic emission layer includes a multilayer functional layer; and a cathode positioned on the organic emission layer;

wherein electrons and holes are transmitting to the organic emission layer by the cathode and the anode respectively and combining with the organic emission layer for light-emitting; a diffusion layer is positioned between at least two adjacent functional layers of the multilayer functional layer, the diffusion layer dissociates metal ions, the metal ions is diffusing to the functional layer adjacent to the diffusion layer for filling traps of the functional layer which is adjacent to the diffusion layer.

12. The display device according to claim 11, wherein the molecular of the diffusion layer includes an organic part and an inorganic part, wherein the organic part is an energy level source of the diffusion layer such that the diffusion layer could transfer or block the electrodes and/or holes; the inorganic part is dissociable metal ions, the metal ions could dissociate and diffuse from the diffusion layer to the adjacent functional layer for filling traps of the functional layer.

13. The display device according to claim 12, wherein the organic part of the structure of the diffusion layer is benzene ring or five-membered heterocyclic or six-membered heterocyclic which containing at least one of nitrogen, oxygen, sulfur and phosphorous.

14. The display device according to claim 11, wherein the metal ions are forming by at least one of main group I, main group II, subgroup III, subgroup IV and subgroup V.

15. The display device according to claim 11, wherein the organic light emitting diode comprises a substrate, the substrate is for supporting entire organic light emitting diode, the anode, the organic emission layer and the cathode are sequentially forming on the substrate.

16. The display device according to claim 11, wherein the multilayer functional layer comprising a hole inject layer, a hole transporting layer, an emitting layer, an electron transport layer and an electron inject layer, and between any two of adjacent the hole inject layer, the hole transporting layer, the emitting layer, the electron transport layer and the electron inject layer are positioning the diffusion layer.

17. The display device according to claim 16, wherein the diffusion layer is positioned between the hole inject layer and the hole transporting layer, and the diffusion layer is positioned between the hole transporting layer and the emitting layer.

18. The display device according to claim 16, wherein the diffusion layer is positioned between the hole inject layer and the hole transporting layer, or the diffusion layer is positioned between the hole transporting layer and the emitting layer.

19. The display device according to claim 16, wherein between the electron inject layer and the electron transport layer and between the electron transport layer and the emitting layer are respectively positioned the diffusion layers; or between the electron inject layer and the electron transport layer is positioned the diffusion layer; or between the electron transport layer and the emitting layer is positioned the diffusion layer.

20. The display device according to claim 12, wherein the multilayer functional layer comprising a hole inject layer, a hole transporting layer, an emitting layer, an electron transport layer and an electron inject layer, and between any two of adjacent the hole inject layer, the hole transporting layer, the emitting layer, the electron transport layer and the electron inject layer are positioning the diffusion layer.

* * * * *